US010181826B2

(12) United States Patent
Khlat et al.

(10) Patent No.: US 10,181,826 B2
(45) Date of Patent: Jan. 15, 2019

(54) ENVELOPE TRACKING AMPLIFIER CIRCUIT

(71) Applicant: Qorvo US, Inc., Greensboro, NC (US)

(72) Inventors: Nadim Khlat, Cugnaux (FR); Philippe Gorisse, Brax (FR); Jeffrey D. Potts, Mocksville, NC (US); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/723,460

(22) Filed: Oct. 3, 2017

(65) Prior Publication Data

US 2018/0309414 A1    Oct. 25, 2018

Related U.S. Application Data

(60) Provisional application No. 62/489,714, filed on Apr. 25, 2017.

(51) Int. Cl.
| | |
|---|---|
| *H03F 1/32* | (2006.01) |
| *H03F 1/02* | (2006.01) |
| *H03F 3/24* | (2006.01) |
| *H03F 1/18* | (2006.01) |
| *H03F 1/30* | (2006.01) |
| *H03F 3/19* | (2006.01) |

(52) U.S. Cl.
CPC ......... *H03F 1/3247* (2013.01); *H03F 1/0211* (2013.01); *H03F 1/18* (2013.01); *H03F 1/301* (2013.01); *H03F 1/3282* (2013.01); *H03F 3/19* (2013.01); *H03F 3/245* (2013.01); *H03F 2200/451* (2013.01)

(58) Field of Classification Search
CPC ..................................................... H03F 1/3247
See application file for complete search history.

(56) References Cited

U.S. PATENT DOCUMENTS

| | | |
|---|---|---|
| 7,043,213 B2 | 5/2006 | Robinson et al. |
| 7,471,155 B1 | 12/2008 | Levesque |

(Continued)

OTHER PUBLICATIONS

U.S. Appl. No. 15/459,449, filed Mar. 15, 2017.

(Continued)

*Primary Examiner* — Patricia T Nguyen
(74) *Attorney, Agent, or Firm* — Withrow & Terranova, P.L.L.C.

(57) ABSTRACT

Aspects disclosed in the detailed description include an envelope tracking (ET) amplifier circuit. The ET amplifier circuit includes ET tracker circuitry configured to provide an ET modulated voltage, which tracks an ET modulated target voltage, to an amplifier circuit(s) for amplifying a radio frequency (RF) signal. The ET amplifier circuit also includes fast switcher circuitry that is activated to provide an alternate current (AC) current to the amplifier circuit(s) when the RF signal includes a higher number of resource blocks (RBs). However, the fast switcher circuitry and its associated control circuitry may incur a processing delay that can cause the fast switcher circuitry to lag behind the ET modulated target voltage. As such, the ET amplifier circuit further includes timing adjustment circuitry to help compensate for the processing delay, thus helping to maintain efficiency of the ET tracker circuitry for improved performance of the ET amplifier circuit.

20 Claims, 5 Drawing Sheets

(56) References Cited

U.S. PATENT DOCUMENTS

| | | | |
|---|---|---|---|
| 7,570,931 B2 | 8/2009 | McCallister et al. | |
| 8,461,928 B2 | 6/2013 | Yahav et al. | |
| 8,879,665 B2 * | 11/2014 | Xia | H03G 3/3042 375/297 |
| 8,913,690 B2 * | 12/2014 | Onishi | H04L 27/361 375/296 |
| 8,989,682 B2 | 3/2015 | Ripley et al. | |
| 9,041,365 B2 | 5/2015 | Kay et al. | |
| 9,098,099 B2 | 8/2015 | Park et al. | |
| 9,166,830 B2 | 10/2015 | Camuffo et al. | |
| 9,225,362 B2 | 12/2015 | Drogi et al. | |
| 9,263,997 B2 | 2/2016 | Vinayak | |
| 9,288,098 B2 | 3/2016 | Yan et al. | |
| 9,344,304 B1 | 5/2016 | Cohen | |
| 9,356,512 B2 | 5/2016 | Chowdhury et al. | |
| 9,520,907 B2 | 12/2016 | Peng et al. | |
| 9,584,071 B2 | 2/2017 | Khlat | |
| 9,595,981 B2 | 3/2017 | Khlat | |
| 9,748,845 B1 * | 8/2017 | Kotikalapoodi | H02M 3/1584 |
| 9,806,676 B2 | 10/2017 | Balteanu et al. | |
| 9,923,520 B1 | 3/2018 | Abdelfattah et al. | |
| 2009/0045872 A1 * | 2/2009 | Kenington | H04B 1/0475 330/127 |
| 2011/0136452 A1 * | 6/2011 | Pratt | H03F 1/3241 455/127.1 |
| 2012/0194274 A1 | 8/2012 | Fowers et al. | |
| 2013/0021827 A1 | 1/2013 | Ye | |
| 2013/0187711 A1 | 7/2013 | Goedken et al. | |
| 2014/0009226 A1 | 1/2014 | Severson et al. | |
| 2014/0155002 A1 | 6/2014 | Dakshinamurthy et al. | |
| 2014/0210550 A1 | 7/2014 | Mathe et al. | |
| 2014/0218109 A1 | 8/2014 | Wimpenny | |
| 2014/0266428 A1 | 9/2014 | Chiron et al. | |
| 2014/0315504 A1 * | 10/2014 | Sakai | H03F 1/02 455/127.2 |
| 2014/0361830 A1 | 12/2014 | Mathe et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0197627 A1 | 7/2016 | Qin et al. | |
| 2017/0317913 A1 | 11/2017 | Kim et al. | |
| 2017/0338773 A1 * | 11/2017 | Balteanu | H03F 1/0266 |
| 2018/0048276 A1 | 2/2018 | Khlat et al. | |
| 2018/0076772 A1 | 3/2018 | Khesbak et al. | |

OTHER PUBLICATIONS

U.S. Appl. No. 15/704,131, filed Sep. 14, 2017.
U.S. Appl. No. 15/728,202, filed Oct. 9, 2017.
U.S. Appl. No. 15/792,909, filed Oct. 25, 2017.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Notice of Allowance for U.S. Appl. No. 15/459,449, dated Mar. 28, 2018, 7 pages.
Non-Final Office Action for U.S. Appl. No. 15/792,909, dated May 18, 2018, 13 pages.
Notice of Allowance for U.S. Appl. No. 15/728,202, dated Aug. 2, 2018, 7 pages.
Notice of Allowance for U.S. Appl. No. 15/704,131, dated Jul. 17, 2018, 7 pages.

\* cited by examiner

ENVELOPE TRACKING AMPLIFIER CIRCUIT

RELATED APPLICATIONS

This application claims the benefit of provisional patent application Ser. No. 62/489,714, filed Apr. 25, 2017, the disclosure of which is hereby incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals. In addition, it can help to further improve efficiency of the PAs by minimizing electrical currents sourced from the PAs.

SUMMARY

Aspects disclosed in the detailed description include an envelope tracking (ET) amplifier circuit. The ET amplifier circuit includes ET tracker circuitry configured to provide an ET modulated voltage, which tracks an ET modulated target voltage, to an amplifier circuit(s) for amplifying a radio frequency (RF) signal. The ET amplifier circuit also includes fast switcher circuitry that is activated to provide an alternate current (AC) current to the amplifier circuit(s) when the RF signal includes a higher number of resource blocks (RBs) (e.g., more than 300 RBs). By supplying the AC current from the fast switcher circuitry, it is possible to minimize the AC current sourced from the ET tracker circuitry, thus helping to improve efficiency of the ET tracker circuitry. However, the fast switcher circuitry and its associated control circuitry may incur a processing delay that can cause the fast switcher circuitry to lag behind the ET modulated target voltage. As such, the ET amplifier circuit further includes timing adjustment circuitry to help compensate for the processing delay, thus helping to maintain efficiency of the ET tracker circuitry for improved performance of the ET amplifier circuit.

In one aspect, an ET amplifier circuit is provided. The ET amplifier circuit includes an output node configured to provide an ET modulated voltage to at least one amplifier circuit for amplifying an RF signal. The ET amplifier circuit also includes ET tracker circuitry. The ET tracker circuitry includes a tracker input configured to receive an ET modulated target voltage. The ET tracker circuitry also includes a tracker output coupled to the output node and configured to output the ET modulated voltage tracking the ET modulated target voltage. The ET amplifier circuit also includes fast switcher circuitry coupled to the tracker output. The ET amplifier circuit also includes fast switcher controller. The fast switcher controller is configured to receive a time-advanced sense current indicative of an AC current sourced by the ET tracker circuitry and a determined timing advance relative to the ET modulated target voltage. The fast switcher controller is also configured to activate the fast switcher circuitry to provide the AC current to the tracker output in response to the time-advanced sense current indicating that the AC current sourced by the ET tracker circuitry is greater than zero. The ET amplifier circuit also includes timing adjustment circuitry coupled between the tracker input and the fast switcher controller. The timing adjustment circuitry is configured to generate the determined timing advance in the time-advanced sense current. The timing adjustment circuitry is also configured to delay the ET modulated target voltage by the determined timing advance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
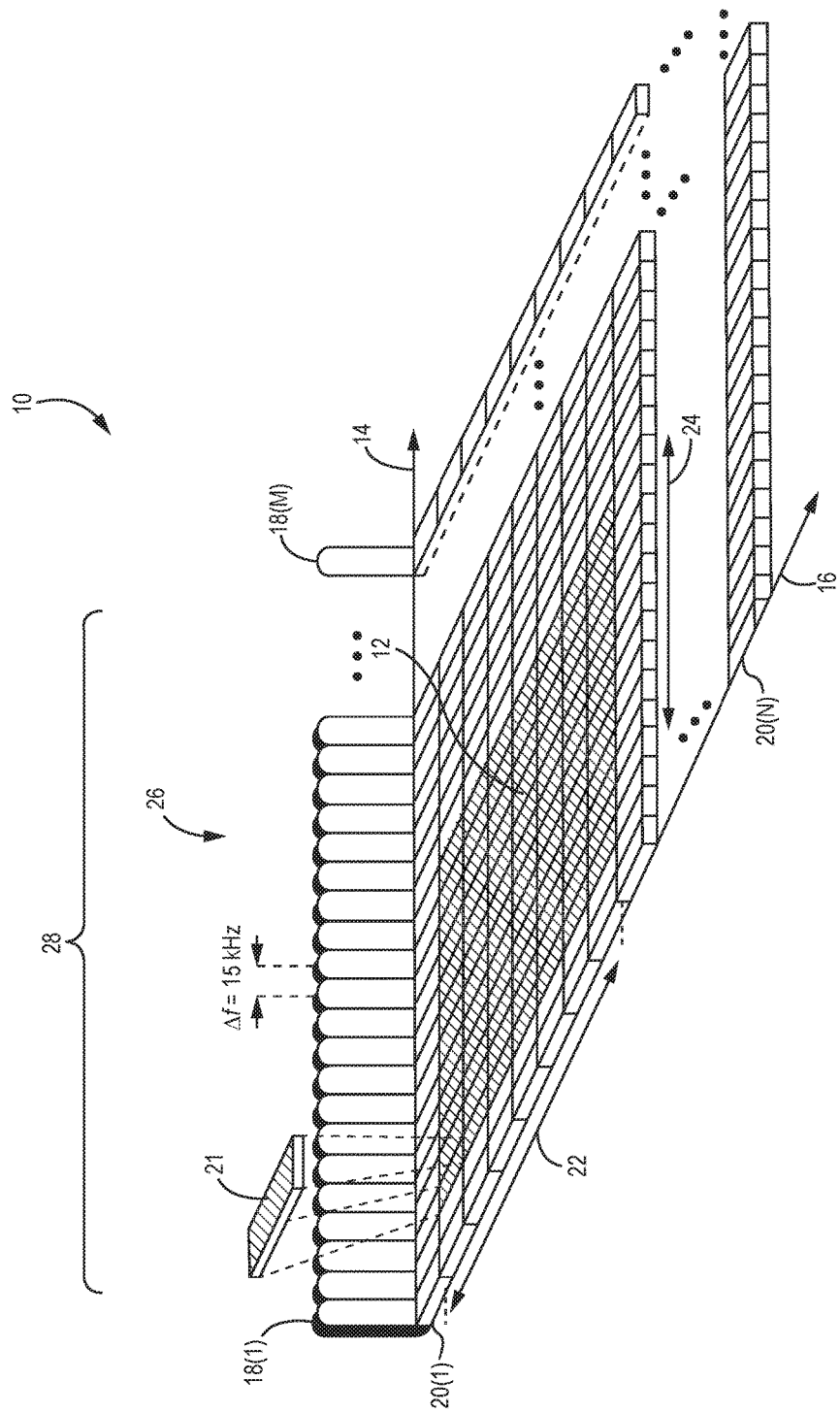
FIG. 1 is a schematic diagram of an exemplary orthogonal frequency division multiplexing (OFDM) time-frequency grid illustrating at least one resource block (RB)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) amplifier circuit. The ET amplifier circuit includes ET tracker circuitry configured to provide an ET modulated voltage, which tracks an ET modulated target voltage, to an amplifier circuit(s) for amplifying a radio frequency (RF) signal. The ET amplifier circuit also includes fast switcher circuitry that is activated to provide an alternate current (AC) current to the amplifier circuit(s) when the RF signal includes a higher number of resource blocks (RBs) (e.g., more than 300 RBs). By supplying the AC current from the fast switcher circuitry, it is possible to minimize the AC current sourced from the ET tracker circuitry, thus helping to improve efficiency of the ET tracker circuitry. However, the fast switcher circuitry and its associated control circuitry may incur a processing delay that can cause the fast switcher circuitry to lag behind the ET modulated target voltage. As such, the ET amplifier circuit further includes timing adjustment circuitry to help compensate for the processing delay, thus helping to maintain efficiency of the ET tracker circuitry for improved performance of the ET amplifier circuit.

Before discussing the ET amplifier circuit of the present disclosure, a brief overview of an RB-based resource allocation scheme is first provided with reference FIG. 1 to help understand the relationship between bandwidth of an RF signal and the number of RBs allocated to the RF signal. A brief discussion of an ET amplifier circuit, which can be adapted to provide the ET amplifier circuit of the present disclosure, is then provided with reference to FIG. 2. The discussion of specific exemplary aspects of an ET amplifier circuit according to the present disclosure starts below with reference to FIG. 3.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there is a plurality of subcarriers 18(1)-18(M). The subcarriers 18(1)-18(M) are orthogonally separated from each other by a frequency spacing $\Delta f$ of 15 KHz. Along the time axis 16, there is a plurality of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals a one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE) and fifth-generation new radio (5G-NR), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, a power amplifier circuit would need to operate fast enough to keep up with the faster amplitude variations of the RF signal 26 across the signal bandwidth 28 within the RB duration 22. Accordingly, a circuit providing ET modulated voltage to the power amplifier circuit needs to provide the ET modulation at a faster frequency (e.g., 250 MHz or above) to keep up with the fast operation of the power amplifier circuit.

Figure 2:
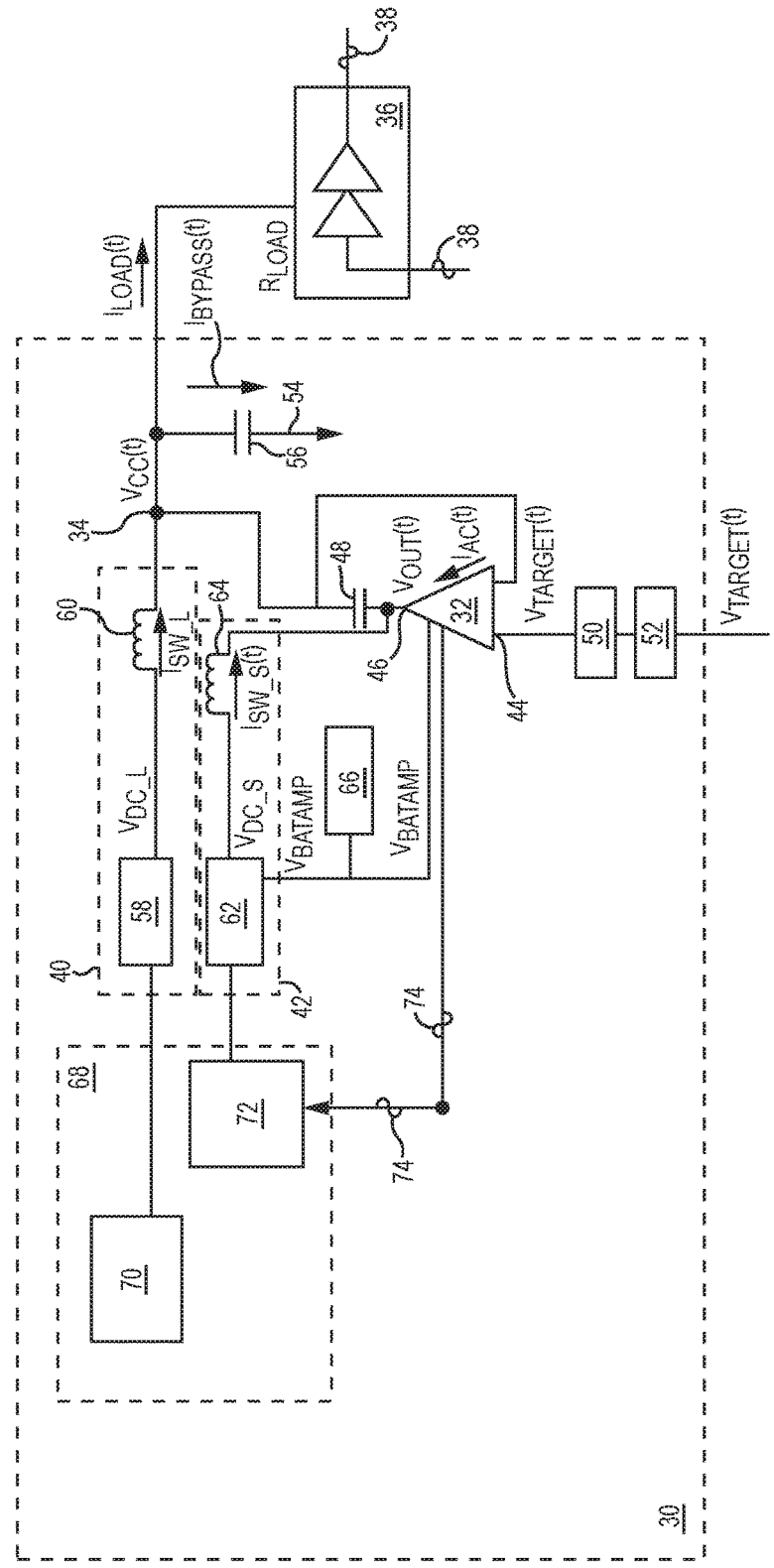
FIG. 2 is a schematic diagram of an exemplary envelope tracking (ET) amplifier circuit including ET tracker circuitry configured to generate an ET modulated voltage that tracks an ET modulated target voltage.

In this regard, FIG. 2 is a schematic diagram of an exemplary ET amplifier circuit 30 including ET tracker circuitry 32 configured to generate an ET modulated voltage $V_{CC}(t)$ that tracks an ET modulated target voltage $V_{TARGET}(t)$. The ET amplifier circuit 30 includes an output node 34 coupled to at least one power amplifier circuit 36. In a non-limiting example, the power amplifier circuit 36 can be a serial amplifier circuit, which includes a driver stage amplifier and an output stage amplifier coupled in tendon, or a differential amplifier circuit, which includes a driver stage amplifier and an output stage differential amplifier coupled in tendon. The power amplifier circuit 36 is configured to amplify an RF signal 38 to a determined power.

The ET amplifier circuit 30 includes slow switcher circuitry 40 and fast switcher circuitry 42. In a non-limiting example, the fast switcher circuitry 42 can be activated when the RF signal 38 includes a higher number of RBs (e.g., >100 RBs) to help minimize AC current supplied by the ET tracker circuitry 32, thus improving operating efficiency of the ET tracker circuitry 32 and the ET amplifier circuit 30 as a whole.

The ET tracker circuitry 32 includes a tracker input 44 and a tracker output 46. The ET tracker circuitry 32 receives the ET modulated target voltage $V_{TARGET}(t)$ at the tracker input 44 and generates an ET modulated output voltage $V_{OUT}(t)$, which tracks the ET modulated target voltage $V_{TARGET}(t)$, at the tracker output 46. The tracker output 46 is coupled to the output node 34 via an offset capacitor 48. The offset capacitor 48 is configured to convert the ET modulated output voltage $V_{OUT}(t)$ into the ET modulated voltage $V_{CC}(t)$ at the output node 34. Given that the ET modulated output voltage $V_{OUT}(t)$ tracks the ET modulated target voltage $V_{TARGET}(t)$, the ET modulated voltage $V_{CC}(t)$ also tracks the ET modulated target voltage $V_{TARGET}(t)$. In a non-limiting example, the ET modulated voltage $V_{CC}(t)$ is one volt (1 V) higher than the ET modulated output voltage $V_{OUT}(t)$.

The tracker input 44 is coupled to filter circuitry 50 and the filter circuitry 50 is coupled to a programmable pole-zero amplifier 52. The programmable pole-zero amplifier 52 is configured to maintain stability of the ET modulated target voltage $V_{TARGET}(t)$ and thus helps to avoid non-linearity issues in the ET tracker circuitry 32 and the ET amplifier circuit 30 as a whole.

In the ET amplifier circuit 30, the ET modulated target voltage $V_{TARGET}(t)$ provides a target voltage envelope for the ET modulated voltage $V_{CC}(t)$, which serves as a supply voltage to the power amplifier circuit 36 for amplifying the RF signal 38. The power amplifier circuit 36 has a load line $R_{LOAD}$, which induces a load current $I_{LOAD}(t)$ based on the ET modulated voltage $V_{CC}(t)$ (e.g., $I_{LOAD}(t)=V_{CC}(t)$ ÷$R_{LOAD}$). Accordingly, the power amplifier circuit 36 can amplify the RF signal 38 to a determined power (e.g., 23 dBm) based on the ET modulated voltage $V_{CC}(t)$ and the load current $I_{LOAD}(t)$. The output node 34 is also coupled to a bypass path 54 including a bypass capacitor 56. The bypass capacitor 56 generates a bypass current $I_{BYPASS}(t)$ based on the ET modulated voltage $V_{CC}(t)$.

The slow switcher circuitry 40 includes a first DC-DC converter 58 and a first inductor 60. The first DC-DC converter 58 is configured to generate a first DC voltage $V_{DC\_L}$. The first inductor 60, which can have a first inductance $L_1$ between 1.1 μH and 2.2 μH for example, induces a DC current $I_{SW\_L}$.

The fast switcher circuitry 42 includes a second DC-DC converter 62 and a second inductor 64. The second DC-DC converter 62 is configured to generate a second DC voltage $V_{DC\_S}$ based on a supply voltage $V_{BATAMP}$ supplied by an inductor-based buck-boost circuit 66. The inductor-based buck-boost circuit 66 also provides the supply voltage $V_{BATAMP}$ to the ET tracker circuitry 32. The second inductor 64, which has a second inductance $L_2$ between 100 nano-Henry (nH) and 200 nH, induces an AC current $I_{SW\_S}(t)$. When activated, the fast switcher circuitry 42 can provide the AC current $I_{SW\_S}(t)$ to the tracker output 46 and subsequently to the output node 34 via the offset capacitor 48. In this regard, the AC current $I_{SW\_S}(t)$ may replace the AC current $I_{AC}(t)$ supplied by the ET tracker circuitry 32, thus helping to improve the operating efficiency of the ET tracker circuitry 32.

The ET amplifier circuit 30 includes a control circuit 68. The control circuit 68 includes a slow switcher controller 70 coupled to the slow switcher circuitry 40 and a fast switcher controller 72 coupled to the fast switcher circuitry 42. In a non-limiting example, the slow switcher controller 70 and the fast switcher controller 72 are both provided as bang-bang controllers (BBCs).

The slow switcher controller 70 is configured to activate the slow switcher circuitry 40 to provide the DC current $I_{SW\_L}$ to the output node 34. The fast switcher controller 72 is configured to activate the fast switcher circuitry 42 to provide the AC current $I_{SW\_S}(t)$ to the tracker output 46 and subsequently to the output node 34. In this regard, the following equation (Eq. 1) exists between the AC currents converging at the output node 34.

$$I_{SW\_s}(t)+I_{AC}(t)=I_{LOAD}(t)+I_{BYPASS}(t) \quad \text{(Eq. 1)}$$

Accordingly, by minimizing the AC current $I_{AC}(t)$ sourced by the ET tracker circuitry 32, the equation (Eq. 1) can be further expressed as equation (Eq. 1.1) below.

$$I_{SW\_s}(t)=I_{LOAD}(t)+I_{BYPASS}(t) \quad \text{(Eq. 1.1)}$$

In this regard, to ensure higher operating efficiency in the ET tracker circuitry 32, the fast switcher circuitry 42 needs to be activated as soon as the fast switcher controller 72 detects that the ET tracker circuitry 32 is sourcing the AC current $I_{AC}(t)$ to the output node 34. In a non-limiting example, the ET tracker circuitry 32 is configured to provide a tracker sense current 74 to the fast switcher controller 72. The tracker sense current 74 is indicative of the AC current IWO being sourced or sank by the ET tracker circuitry 32. The tracker sense current 74 is a positive current (e.g., greater than zero) when the ET tracker circuitry 32 sources the AC current $I_{AC}(t)$ to the output node 34. In contrast, the tracker sense current 74 is a negative current (e.g., lesser than zero) when the ET tracker circuitry 32 sinks the AC current $I_{AC}(t)$ from the output node 34. Accordingly, the fast switcher controller 72 can be configured to activate the fast switcher circuitry 42 to provide the AC current $I_{SW\_S}$(t) to replace the AC current $I_{AC}$(t) in response to the tracker sense current 74 indicating that the ET tracker circuitry 32 is sourcing the AC current $I_{AC}$(t) to the output node 34. In contrast, the fast switcher controller 72 deactivates the fast switcher circuitry 42 in response to the tracker sense current 74 indicating that the ET tracker circuitry 32 is sinking the AC current $I_{AC}$(t) from the output node 34.

However, inherent processing latency associated with the fast switcher controller 72 and the fast switcher circuitry 42 can cause the AC current $I_{SW\_S}$(t) to lag behind a rising and/or falling slope(s) of the ET modulated target voltage $V_{TARGET}$(t). As a result, the ET tracker circuitry 32 may be forced to source the AC current $I_{AC}$(t), thus compromising operating efficiency of the ET tracker circuitry 32. Hence, it may be desired to add a timing advance in the tracker sense current 74 to compensate for the processing delays associated with the fast switcher controller 72 and the fast switcher circuitry 42.

As discussed below in FIGS. 3 and 5, the ET amplifier circuit 30 can be adapted to compensate for the processing latency associated with the fast switcher controller 72 and the fast switcher circuitry 42 by providing a time-advanced sense current, which is indicative of the AC current $I_{AC}$(t) sourced by the ET tracker circuitry 32, and a determined timing advance relative to the ET modulated target voltage $V_{TARGET}$(t), to the fast switcher controller 72. In a non-limiting example, the determined timing advance is at least determined based on the processing delay associated with the fast switcher controller 72 and the fast switcher circuitry 42. The time-advanced sense current may be generated by combining the determined timing advance with the tracker sense current 74. In addition, the ET modulated target voltage $V_{TARGET}$(t) may be delayed by at least the determined timing advance to help mitigate the processing latency associated with the fast switcher controller 72 and the fast switcher circuitry 42. As a result, as illustrated in FIG. 4, it is possible to minimize the AC current $I_{AC}$(t) sourced by the ET tracker circuitry 32, thus helping to improve operating efficiency of the ET tracker circuitry 32. Furthermore, generating the determined timing advance and delaying the ET modulated target voltage $V_{TARGET}$(t) can both be accomplished based on the programmable pole-zero amplifier 52 that already exists in the ET amplifier circuit 30. As such, the ET amplifier circuit 30 can be adapted to improve the operating efficiency of the ET tracker circuitry 32 with minimum hardware addition to help reduce cost, footprint, implementation complexity, and/or potential performance degradation.

Figure 3:
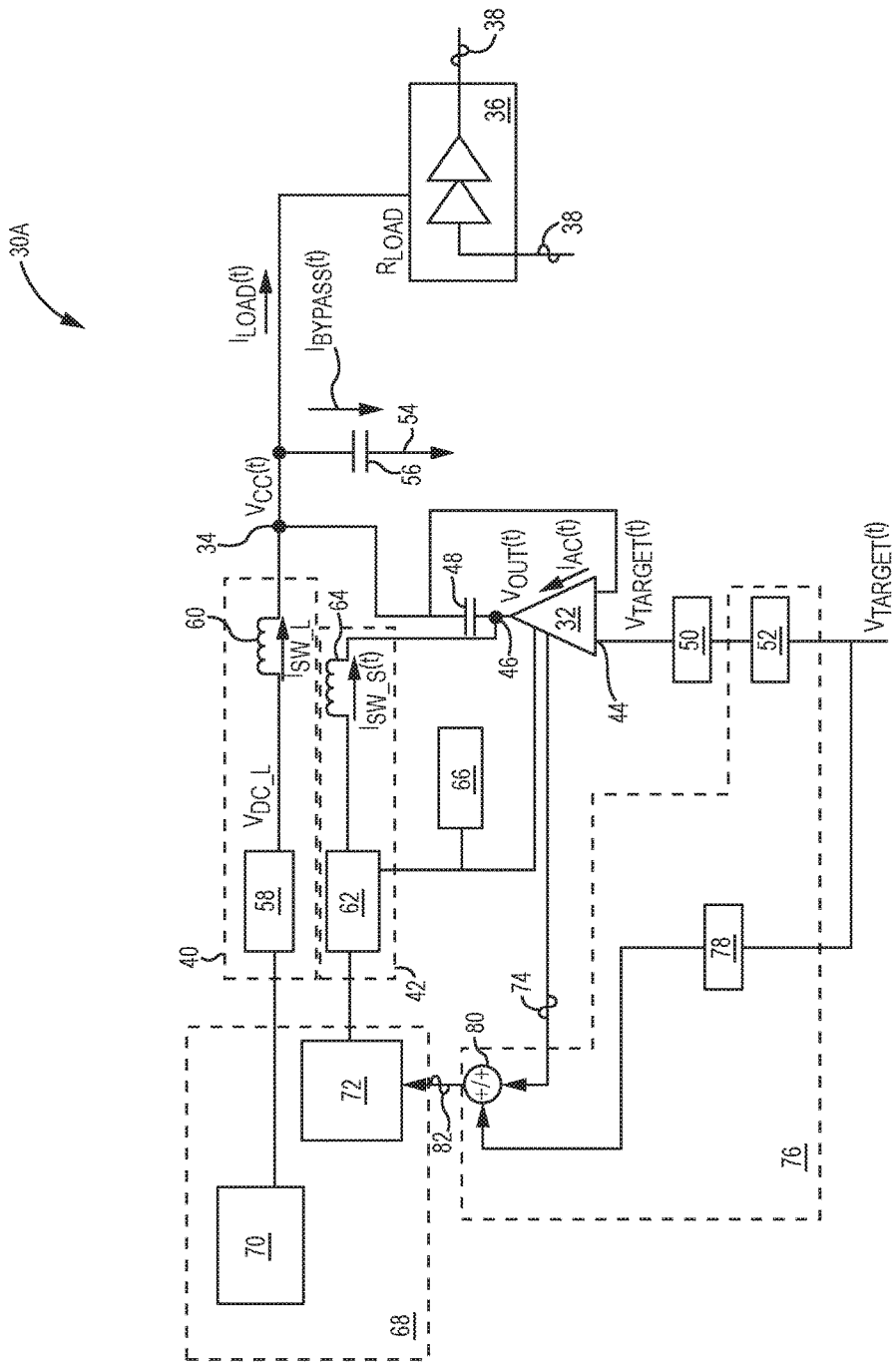
FIG. 3 is a schematic diagram of an exemplary ET amplifier circuit adapted based on the ET amplifier circuit of FIG. 2 to help improve the operating efficiency of the ET tracker circuitry.
Figure 4:
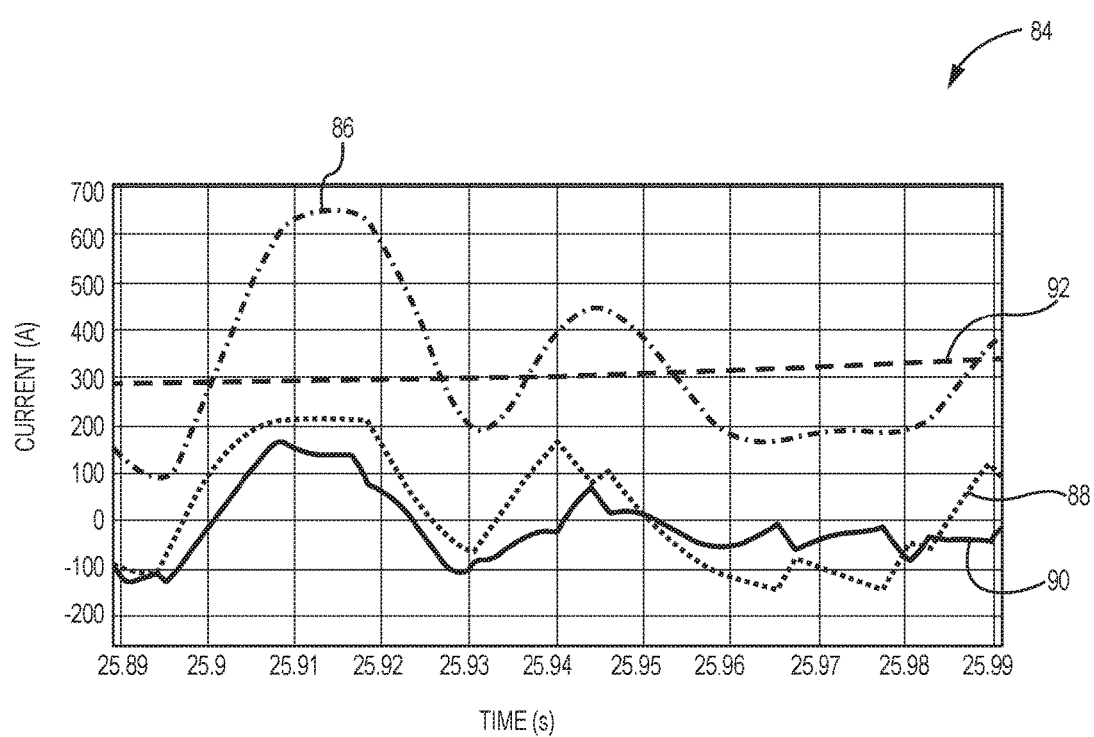
FIG. 4 is a graph providing an exemplary illustration of various currents in the ET amplifier circuit of FIG. 3.

In this regard, FIG. 3 is a schematic diagram of an exemplary ET amplifier circuit 30A adapted based on the ET amplifier circuit 30 of FIG. 2 to help improve the operating efficiency of the ET tracker circuitry 32. Common elements between FIGS. 2 and 3 are shown therein with common element numbers and will not be re-described herein.

The ET amplifier circuit 30A includes timing adjustment circuitry 76. In a non-limiting example, the timing adjustment circuitry 76 includes the programmable pole-zero amplifier 52, a timing advance generator 78, and current summing circuitry 80. The current summing circuitry 80 is coupled to the fast switcher controller 72. The programmable pole-zero amplifier 52 is coupled to the tracker input 44 via the filter circuitry 50. The timing advance generator 78 is coupled between the programmable pole-zero amplifier 52 and the current summing circuitry 80.

The timing adjustment circuitry 76 is configured to generate a time-advanced sense current 82 that is indicative of the AC current $I_{AC}$(t) sourced by the ET tracker circuitry 32 and a determined timing advance relative to the ET modulated target voltage $V_{TARGET}$(t). In a non-limiting example, the determined timing advance is so determined based on the processing latency associated with the fast switcher controller 72 and the fast switcher circuitry 42. The timing adjustment circuitry 76 is further configured to delay the ET modulated target voltage $V_{TARGET}$(t) by at least the determined timing advance. As a result, the ET tracker circuitry 32 receives a delayed ET modulated target voltage $V'_{TARGET}$(t) at the tracker input 44 instead of receiving the ET modulated target voltage $V_{TARGET}$(t). By incorporating the determined time advance in the time-advanced sense current 82 and delaying the ET modulated target voltage $V_{TARGET}$(t) by at least the determined timing advance, the fast switcher controller 72 is able to detect the AC current $I_{AC}$(t) sourced by the ET tracker circuitry 32 and activate the fast switcher circuitry 42 to provide the AC current $I_{SW\_S}$(t) in a timely manner. As a result, as illustrated in FIG. 4, it is possible to minimize the AC current $I_{AC}$(t) sourced by the ET tracker circuitry 32 for improved operating efficiency.

FIG. 4 is a graph 84 providing an exemplary illustration of the load current $I_{LOAD}$(t) flowing through the power amplifier circuit 36, the AC current $I_{AC}$(t) sourced by the ET tracker circuitry 32, and the AC current $I_{SW\_S}$(t) provided by the fast switcher circuitry 42. Elements of FIG. 3 are referenced in conjunction with FIG. 4 and will not be re-described herein.

The graph 84 includes a first current curve 86, a second current curve 88, a third current curve 90, and a fourth current curve 92. The first current curve 86 represents the load current $I_{LOAD}$(t), the second current curve 88 represents the AC current $I_{SW\_S}$(t) generated by the fast switcher circuitry 42, the third current curve 90 represents the AC current $I_{AC}$(t) sourced by the ET tracker circuitry 32, and the fourth current curve 92 represents the DC current $I_{DC}$ supplied by the slow switcher circuitry 40. The graph 84 indicates that, as a result of incorporating the determined time advance in the time-advanced sense current 82 and delaying the ET modulated target voltage $V_{TARGET}$(t) by at least the determined timing advance, the AC current $I_{AC}$(t) sourced by the ET tracker circuitry 32 can be minimized, although not completely eliminated. As such, the ET tracker circuitry 32 can operate at a higher efficiency.

Figure 5:
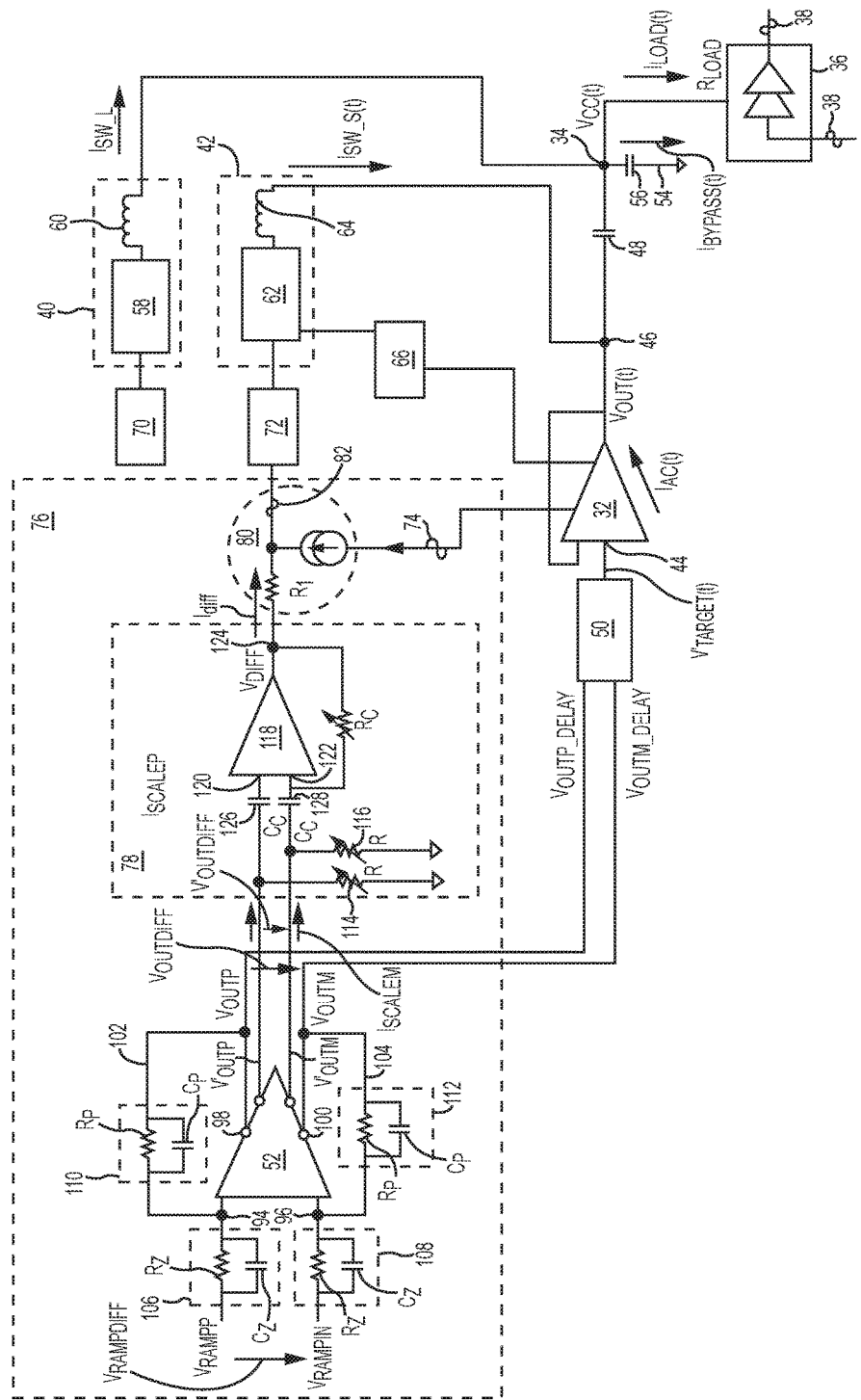
FIG. 5 is a schematic diagram providing illustration of the ET amplifier circuit of FIG. 3 with more exemplary implementation details.

FIG. 5 is a schematic diagram providing illustration of the ET amplifier circuit 32A of FIG. 3 with exemplary implementation details of the timing adjustment circuitry 76. Common elements between FIGS. 3 and 5 are shown therein with common element numbers and will not be re-described herein.

In a non-limiting example, the programmable pole-zero amplifier 52 is a differential amplifier. The programmable pole-zero amplifier 52 includes a positive voltage input 94, a negative voltage input 96, a positive voltage output 98, and a negative voltage output 100. The positive voltage input 94 and the negative voltage input 96 are configured to receive a positive input voltage $V_{rampp}$ and a negative input voltage $V_{rampm}$, respectively. The positive input voltage $V_{rampp}$ and the negative input voltage $V_{rampm}$ create a differential input voltage $V_{rampdiff}$ ($V_{rampdiff}=V_{rampp}-V_{rampm}$). The positive voltage output 98 and the negative voltage output 100 are configured to output a positive output voltage $V_{outp}$ and a negative output voltage $V_{outm}$, respectively. The positive out voltage $V_{outp}$ and the negative output voltage $V_{outm}$ create a differential output voltage $V_{outdiff}$ ($V_{outdiff}=V_{outp}-V_{outm}$).

The programmable pole-zero amplifier 52 includes a positive voltage feedback loop 102 coupled from the positive voltage output 98 to the positive voltage input 94. The programmable pole-zero amplifier 52 includes a negative voltage feedback loop 104 coupled from the negative voltage output 100 to the negative voltage input 96.

The programmable pole-zero amplifier 52 also includes positive resistor-capacitor (RC) circuitry 106 coupled to the positive voltage input 94 and negative RC circuitry 108 coupled to the negative voltage input 96. Each of the positive RC circuitry 106 and the negative RC circuitry 108 includes a respective resistor $R_Z$ and a respective capacitor $C_Z$. The programmable pole-zero amplifier 52 further includes positive feedback RC circuitry 110 provided in the positive voltage feedback loop 102 and negative feedback RC circuitry 112 provided in the negative voltage feedback loop 104. Each of the positive feedback RC circuitry 110 and the negative feedback RC circuitry 112 includes a respective resistor $R_P$ and a respective capacitor $C_P$.

The programmable pole-zero amplifier 52 can be programmed to generate pole output and zero output. In a non-limiting example, the pole output can be programmed via the positive feedback RC circuitry 110 and the negative feedback RC circuitry 112, while the zero output can be programmed via the positive RC circuitry and the negative RC circuitry. Thus the following relationship, as shown in equation (Eq. 2), exists in the programmable pole-zero amplifier 52.

$$V_{outdiff}/V_{rampdiff}=(R_P/R_Z)*(1+R_Z*C_Z*s)/(1+R_P*C_P*S) \quad (Eq.\ 2)$$

In the equation (Eq. 2) above, s represents a transfer function of the programmable pole-zero amplifier 52. In a non-limiting example, the zero output of the programmable pole-zero amplifier 52 is provided to the timing advance generator 78 to generate the determined timing advance in the time-advanced sense current 82. More specifically, a mirrored positive voltage $V'_{outp}$ and a mirrored negative voltage $V'_{outm}$ are tapped from the programmable pole-zero amplifier 52 and provided to the timing advance generator 78. The mirrored positive voltage $V'_{outp}$ and the mirrored negative voltage $V'_{outm}$ are proportionally related to the positive output voltage $V_{outp}$ and the negative output voltage $V_{outm}$, respectively based on a scaling factor α. The mirrored positive voltage $V'_{outp}$ and the mirrored negative voltage $V'_{outm}$ create a mirrored differential voltage $V'_{outdiff}$ ($V'_{outdiff}=V'_{outp}-V'_{outm}$).

The mirrored positive voltage $V'_{outp}$ and the mirrored negative voltage $V'_{outm}$ are applied to a first resistor 114 and a second resistor 116, respectively. Each of the first resistor 114 and the second resistor 116 has a resistance R. Accordingly, the first resistor 114 induces a positive input current $I_{scalep}$ ($I_{scalep}=V'_{outp}/R$) and the second resistor 116 induces a negative input current $I_{scalem}$ ($I_{scalem}=V'_{outm}/R$). As such, the mirrored positive voltage $V'_{outp}$, the mirrored negative voltage $V'_{outm}$, and the mirrored differential voltage $V'_{outdiff}$ can be determined based on equation (Eq. 3) below.

$$V'_{outp}=R*I_{scalep}=(R/R_Z)*\alpha*V_{rampp}*(1+R_Z*C_Z*S)$$

$$V'_{outm}=R*I_{scalem}=(R/R_Z)*\alpha*V_{rampm}*(1+R_Z*C_Z*s)$$

$$V'_{outdiff}=(R/R_Z)*V_{rampdiff}*(1+R_Z*C_Z*s) \quad (Eq.\ 3)$$

As shown in equation (Eq. 3), the differential transfer function ($V'_{outdiff}/V_{rampdiff}$) is proportional to ($1+R_Z*C_Z*s$). In this regard, the differential transfer function ($V'_{outdiff}/V_{rampdiff}$) can produce the pole output and the zero output that are programmable based on ($1+R_Z*C_Z*s$).

The timing advance generator 78 includes a differential amplifier 118 having a positive input end 120, a negative input end 122, and a voltage output end 124. The positive input end 120 is coupled to the programmable pole-zero amplifier 52 and the first resistor 114 via a first capacitor 126. The negative input end 122 is coupled to the programmable pole-zero amplifier 52 and the second resistor 116 via a second capacitor 128. The first capacitor 126 and the second capacitor 128 each have a respective capacitance $C_C$. Accordingly, the differential amplifier 118 receives the mirrored positive voltage $V'_{outp}$ and the positive input current $I_{scalep}$ at the positive input end 120. Likewise, the differential amplifier 118 receives the mirrored negative voltage $V'_{outm}$ and the negative input current $I_{scalem}$ at the negative input end 122. The differential amplifier 118 further includes a feedback resistor $R_C$ provided between the voltage output end 124 and the negative input end 122. The differential amplifier 118 outputs a differential output voltage $V_{diff}$ at the voltage output end 124 based on the mirrored positive voltage $V'_{outp}$ and the mirrored negative voltage $V'_{outm}$. The differential output voltage $V_{diff}$ can be determined based on equation (Eq. 4) below.

$$V_{diff}=R_C*C_C*(R/R_Z)*\alpha*V_{rampdiff}*(1+R_Z*C_Z*s) \quad (Eq.\ 4)$$

The current summing circuitry 80 is coupled to the voltage output end 124 of the differential amplifier 118, the ET tracker circuitry 32, and the fast switcher controller 72. The current summing circuitry 80 includes a resistor R1 coupled to the voltage output end 124 and configured to induce a differential current $I_{diff}$ indicative of the determined timing advance based on the differential output voltage $V_{diff}$ of the differential amplifier 118. The current summing circuitry 80 also receives the tracker sense current 74 from the ET tracker circuitry 32. The current summing circuitry 80 combines the differential current $I_{diff}$ with the tracker sense current 74 to generate the time-advanced sense current 82, and provides the time-advanced sense current 82 to the fast switcher controller 72.

Concurrently, the positive out voltage $V_{outp}$ and the negative output voltage $V_{outm}$ are provided to the filter circuitry 50. The filter circuitry 50, which may be a low-pass filter circuitry, is configured to pass at least one of the positive out voltage $V_{outp}$ and the negative output voltage $V_{outm}$ to the tracker input as the ET modulated target voltage $V_{TARGET}(t)$.

In a non-limiting example, it is possible to delay the positive output voltage $V_{outp}$ and the negative output voltage $V_{outm}$ by adjusting a respective RC time constant of the positive feedback RC circuitry 110 and the negative feedback RC circuitry 112. As a result, the filter circuitry 50 receives a delayed positive out voltage $V_{outp\_delay}$ and a delayed negative output voltage $V_{outm\_delay}$. Accordingly, the filter circuitry 50 provides the delayed ET modulated target voltage $V_{TARGET}(t)$ to the ET tracker circuitry 32.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) amplifier circuit, comprising:
    an output node configured to provide an ET modulated voltage to at least one amplifier circuit for amplifying a radio frequency (RF) signal;
    ET tracker circuitry comprising:
        a tracker input configured to receive an ET modulated target voltage; and a tracker output coupled to the output node and configured to output the ET modulated voltage tracking the ET modulated target voltage;

fast switcher circuitry coupled to the tracker output;

a fast switcher controller configured to:
receive a time-advanced sense current indicative of an alternate current (AC) current sourced by the ET tracker circuitry and a determined timing advance relative to the ET modulated target voltage; and
activate the fast switcher circuitry to provide the AC current to the tracker output in response to the time-advanced sense current indicating that the AC current sourced by the ET tracker circuitry is greater than zero; and timing adjustment circuitry coupled between the tracker input and the fast switcher controller and configured to:
generate the determined timing advance in the time-advanced sense current; and
delay the ET modulated target voltage by the determined timing advance.

2. The ET amplifier circuit of claim 1 wherein the determined timing advance is determined based at least on a processing delay associated with the fast switcher controller and the fast switcher circuitry.

3. The ET amplifier circuit of claim 1 wherein the timing adjustment circuitry comprises:
a programmable pole-zero amplifier coupled to the tracker input and configured to delay the ET modulated target voltage by the determined timing advance; and
a timing advance generator coupled between the programmable pole-zero amplifier and the fast switcher controller to generate the determined timing advance in the time-advanced sense current.

4. The ET amplifier circuit of claim 3 wherein the programmable pole-zero amplifier comprises:
a positive voltage input configured to receive a positive input voltage;
a negative voltage input configured to receive a negative input voltage;
a positive voltage output configured to output a positive output voltage;
a negative voltage output configured to output a negative output voltage;
a positive voltage feedback loop coupled from the positive voltage output to the positive voltage input; and
a negative voltage feedback loop coupled from the negative voltage output to the negative voltage input.

5. The ET amplifier circuit of claim 4 further comprising filter circuitry provided between the programmable pole-zero amplifier and the tracker input and configured to:
receive the positive output voltage and the negative output voltage from the positive voltage output and the negative voltage output, respectively; and
pass at least one of the positive output voltage and the negative output voltage to the tracker input as the ET modulated target voltage.

6. The ET amplifier circuit of claim 5 wherein the filter circuitry is provided by a low-pass filter circuitry.

7. The ET amplifier circuit of claim 4 wherein the programmable pole-zero amplifier further comprises:
positive resistor-capacitor (RC) circuitry configured to receive the positive input voltage and provide the positive input voltage to the positive voltage input;
negative RC circuitry configured to receive the negative input voltage and provide the negative input voltage to the negative voltage input;
positive feedback RC circuitry provided in the positive voltage feedback loop; and
negative feedback RC circuitry provided in the negative voltage feedback loop.

8. The ET amplifier circuit of claim 7 wherein the programmable pole-zero amplifier is configured to delay the ET modulated target voltage by the determined timing advance by adjusting a respective RC time constant of the positive feedback RC circuitry and the negative feedback RC circuitry.

9. The ET amplifier circuit of claim 7 wherein the positive RC circuitry and the negative RC circuitry are configured to collectively determine a zero output and a pole output of the programmable pole-zero amplifier.

10. The ET amplifier circuit of claim 9 wherein the timing advance generator is configured to receive the zero output of the programmable pole-zero amplifier and generate the determined timing advance in the time-advanced sense current based on the zero output.

11. The ET amplifier circuit of claim 10 wherein the zero output of the programmable pole-zero amplifier comprises a mirrored positive voltage proportional to the positive output voltage and a mirrored negative voltage proportional to the negative output voltage.

12. The ET amplifier circuit of claim 11 wherein the timing advance generator comprises a differential amplifier comprising:
a positive input end configured to receive the mirrored positive voltage;
a negative input end configured to receive the mirrored negative voltage; and
a voltage output end configured to output a differential output voltage based on the mirrored positive voltage and the mirrored negative voltage.

13. The ET amplifier circuit of claim 12 wherein:
the positive input end is coupled to a first resistor configured to induce a positive input current based on the mirrored positive voltage; and
the negative input end is coupled to a second resistor configured to induce a negative input current based on the mirrored negative voltage.

14. The ET amplifier circuit of claim 12 further comprising current summing circuitry coupled to the differential amplifier of the timing advance generator, the fast switcher controller, and the ET tracker circuitry.

15. The ET amplifier circuit of claim 14 wherein the current summing circuitry comprises a resistor coupled to the voltage output end of the differential amplifier and configured to induce a differential current indicative of the determined timing advance based on the differential output voltage of the differential amplifier.

16. The ET amplifier circuit of claim 15 wherein the ET tracker circuitry is configured to provide a tracker sense current indicative of the AC current sourced by the ET tracker circuitry to the current summing circuitry.

17. The ET amplifier circuit of claim 16 wherein the ET tracker circuitry is further configured to:
generate the tracker sense current as a positive current greater than zero in response to the ET tracker circuitry sourcing the AC current to the output node; and
generate the tracker sense current as a negative current less than zero in response to the ET tracker circuitry sinking the AC current from the output node.

18. The ET amplifier circuit of claim 16 wherein the current summing circuitry is further configured to:
combine the differential current and the tracker sense current to generate the time-advanced sense current indicative of the AC current sourced by the ET tracker circuitry and the determined timing advance relative to the ET modulated target voltage; and provide the time-advanced sense current to the fast switcher controller.

19. The ET amplifier circuit of claim 1 further comprising:

slow switcher circuitry configured to generate a direct current (DC) current; and a slow switcher controller configured to activate the slow switcher circuitry to provide the DC current to the output node.

20. The ET amplifier circuit of claim 19 wherein the fast switcher controller and the slow switcher controller are provided as bang-bang controllers (BBCs).

* * * * *